United States Patent [19]

Yomoda et al.

[11] Patent Number: 4,538,914
[45] Date of Patent: Sep. 3, 1985

[54] TRANSFER APPARATUS FOR COMPENSATING FOR A TRANSFER ERROR

[75] Inventors: Minoru Yomoda, Kawasaki; Izumi Tsukamoto, Tokyo, both of Japan

[73] Assignee: Canon Kabushiki Kaisha, Tokyo, Japan

[21] Appl. No.: 450,349

[22] Filed: Dec. 16, 1982

[30] Foreign Application Priority Data

Dec. 23, 1981 [JP] Japan .................................. 56-208468

[51] Int. Cl.³ .............................................. G03F 9/00
[52] U.S. Cl. ..................................... 356/400; 356/401; 355/52; 355/53
[58] Field of Search ........................ 356/399, 400, 401; 355/55, 52, 53, 63; 350/294

[56] References Cited

U.S. PATENT DOCUMENTS

| | | | |
|---|---|---|---|
| 3,989,385 | 11/1976 | Dill et al. | 356/400 |
| 4,123,150 | 10/1978 | Sziklas | 350/294 |
| 4,127,777 | 11/1978 | Binder | 356/400 |
| 4,275,306 | 6/1981 | Kato et al. | 356/401 |
| 4,316,668 | 2/1982 | Miller | 355/55 |
| 4,348,750 | 9/1982 | Schwind | 350/294 |
| 4,362,385 | 12/1982 | Lobach | 356/401 |

*Primary Examiner*—R. A. Rosenberger
*Assistant Examiner*—Michael F. Vollero
*Attorney, Agent, or Firm*—Fitzpatrick, Cella, Harper & Scinto

[57] ABSTRACT

Disclosed is a transfer apparatus provided with a first body having a plurality of alignment marks, a second body having a plurality of alignment marks, a projection optical system for projecting the image of the first body upon the second body, a probing device for probing the alignment marks of the first body and probing the alignment marks of the second body through the projection optical system, an operation device electrically coupled to the probing device and deriving a transfer error from the alignment error of the alignment marks, and a compensation device coupled to the operation device for eliminating the transfer error and for compensating for the projection optical system.

11 Claims, 10 Drawing Figures

TRANSFER APPARATUS FOR COMPENSATING FOR A TRANSFER ERROR

BACKGROUND OF THE INVENTION

1. Field of the Invention

This invention relates to an apparatus for projecting and transferring a negative onto an information recording carrier, and more particularly to a transfer apparatus in which the transfer error by a projection optical system is compensated for.

2. Description of the Prior Art

In the manufacturing process of semiconductors such as integrated circuits, the step of transferring a mask pattern onto a wafer is necessary and as the marks for aligning a mask and a wafer during the transfer, use is made of mask alignment marks 1 as shown in FIG. 1A of the accompanying drawings and a wafer alignment mark 2 as shown in FIG. 1B of the accompanying drawings. The mask alignment marks 1 and the wafer alignment mark 2 are aligned as shown in FIG. 1C. That is, these alignment marks must be aligned so that the wafer alignment mark 2 is positioned at an equal interval between the alignment marks 1. This registration or alignment accuracy must be highly precise to reduce the transfer strain on the entire surface of the water, and adjustment of the transfer apparatus is extremely difficult.

Also, when the transfer strain is attributable to the projection optical system for transfer, the transfer strain adversely effects the performance of the manufactured products and thus, products unfit for use will be produced in large quantities.

SUMMARY OF THE INVENTION

It is an object of the present invention to compensate for any transfer error caused by a transfer optical apparatus.

It is another object of the present invention to improve the performance of projected images.

It is still another object of the present invention to provide the performance of an optical system which relates a first body to a second body and thereby to improve the accuracy of alignment of the two bodies.

It is yet still another object of the present invention to provide a plurality of accurately positioned alignment marks on first and second standard bodies and to operate a projection error from a set of alignment errors of the marks on the two bodies when aligned.

It is a further object of the present invention to automatically compensate for a projection optical system or apparatus on the basis of an operation error.

The invention will become fully apparent from the following detailed description thereof taken in conjunction with the accompanying drawings.

DESCRIPTION OF THE PREFERRED EMBODIMENTS

Figure 1A:
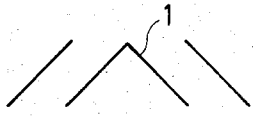
FIG. 1A shows well-known alignment marks provided on a mask.
Figure 1B:
FIG. 1B shows a well-known alignment mark provided on a wafer.
Figure 1C:
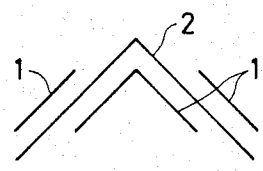
FIG. 1C shows the alignment marks when aligned.
Figure 2:
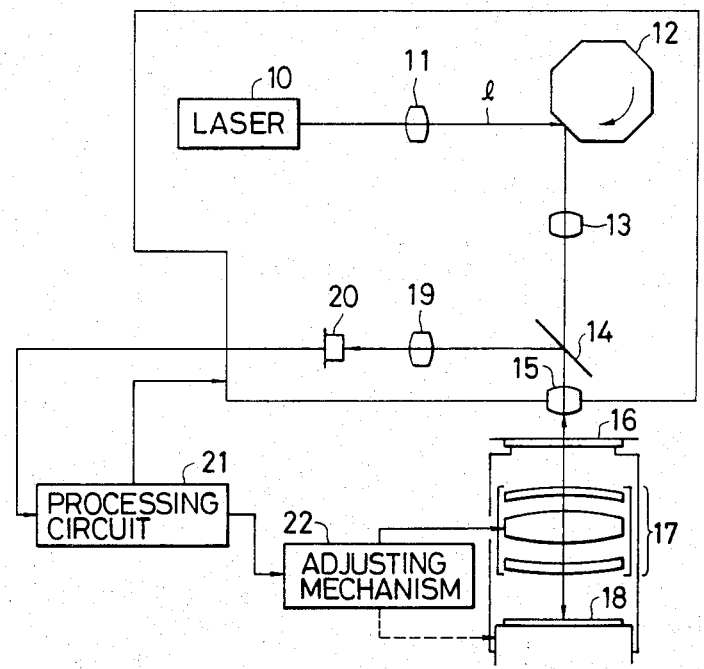
FIG. 2 is a diagram of a combination of an optical system and a compensating system showing a specific embodiment of the present invention.

Referring to FIG. 2, reference numeral 16 designates a standard mask on which the alignment marks as shown in FIG. 1A are disposed at predetermined intervals in a direction perpendicular to the plane of the drawing sheet. Reference numeral 18 denotes a standard wafer on which the alignment marks as shown in FIG. 1B are disposed at an interval with the magnification of a projection optical system taken into account, in a direction perpendicular to the plane of the drawing sheet. The word "standard" means that the mask and wafer are not used for the manufacture of products but have been elaborately made especially for the adjusting operation. Two probing devices each comprising members 10 to 15, 19 and 20 are provided in the vertical direction of the drawing. A condensor lens 11, a polygonal mirror 12 for scanning a laser light source 10, an f·θ lens 13, a half-mirror 14, an objective lens 15, the standard mask 16 having precise alignment marks 1 at a plurality of locations thereon, a projection lens or transfer optical system 17 and the standard wafer 18 having precise alignment marks 2 at a plurality of locations thereon are arranged in succession along the light path of a laser light 1 emitted from the laser light source 10. The reflected light from the mask 16, etc. is reflected by the half-mirror 14 and along the light path of this reflected light, there are arranged a condensor lens 19 and a photoelectric conversion element 20, the output of which is connected to an adjusting driving mechanism 22 for effecting magnification adjustment of the transfer optical system 17 through an operation processing circuit 21. The circuit 21 operates to adjust this magnification by the measured amount in accordance with a predetermined operational form and put out a control signal for accomplishing the adjustment. The adjusting driving mechanism 22 changes the position of the projection lens 17 on the optical axis thereof or changes the spacing between lenses constituting the projection lens 17 and, in some cases, moves a chuck supporting the wafer 18 up and down.

The standard mask 16 and the standard wafer 18 have been mounted on the transfer apparatus during adjustment, and will be replaced by another mask and wafer during the actual transfer.

Figure 3:
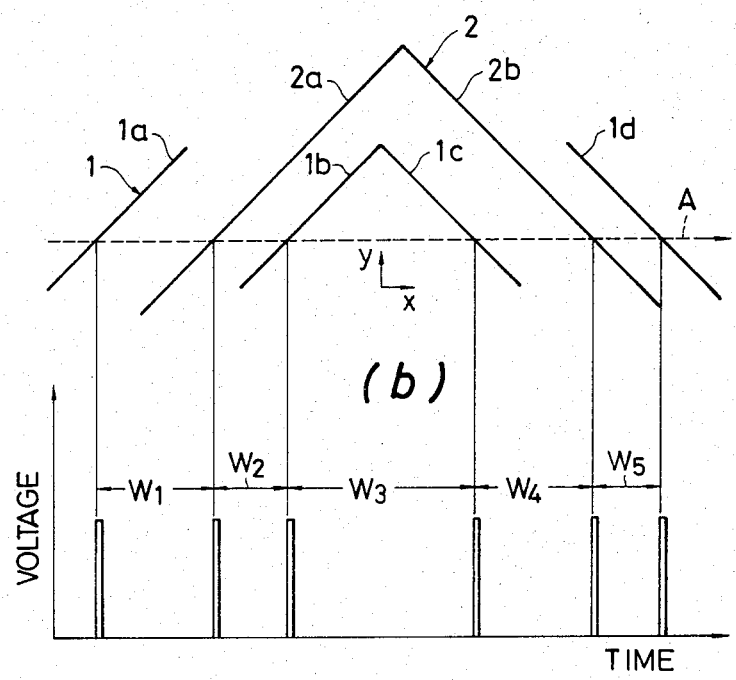
FIG. 3 shows a certain positional relation between two alignment marks during aligning operation and an electrical output corresponding thereto.

The laser light 1 emitted from the laser light source 10 is scanned by the polygonal mirror 12, passes through the half-mirror 14 and travels toward the standard mask 16, etc. The alignment marks 1 of the standard mask 16 and the alignment marks 2 of the standard wafer 18 are scanned by the laser light 1 through the transfer optical system 17, and the light again reaches the half-mirror 14 and here, part of the light is reflected toward the photoelectric conversion element 20. Thereupon, the alignment marks 1 of the standard mask 16 and the alignment marks 2 of the standard wafer 18 are overlapped with each other as shown in FIG. 3(a). The alignment mark 2a of the standard wafer 18 exists between the alignment marks 1a and 1b of the standard mask 16, the alignment mark 2b is positioned between the alignment marks 1c and 1d, and the laser light 1 is scanned in the left to right scanning direction A. The photoelectric conversion element 20 detects a pulse-like output at a location whereat the laser light 1 of FIG. 3(a) intersects the alignment marks 1 and 2 and there is obtained an output voltage waveform as shown in FIG. 3(b). $W_1$, $W_2$, ..., $W_5$ are the spacings or time intervals between pulse signals and by measuring these time intervals $W_1$, $W_2$, ..., $W_5$, an alignment deviation can be found. That is, if the deviation in the x direction of FIG. 3(a) is $\Delta x$ and the deviation in the y direction is $\Delta v$, $$\Delta x = (W_1 - W_2 + W_4 - W_5)/4 \tag{1}$$

$$\Delta y = (-W_1 + W_2 + W_4 - W_5)/4 \tag{2}$$

In the aligned condition, $W_1 = W_2 = W_4 = W_5$ and hence, both $\Delta x$ and $\Delta y$ are zero.

Figure 4:
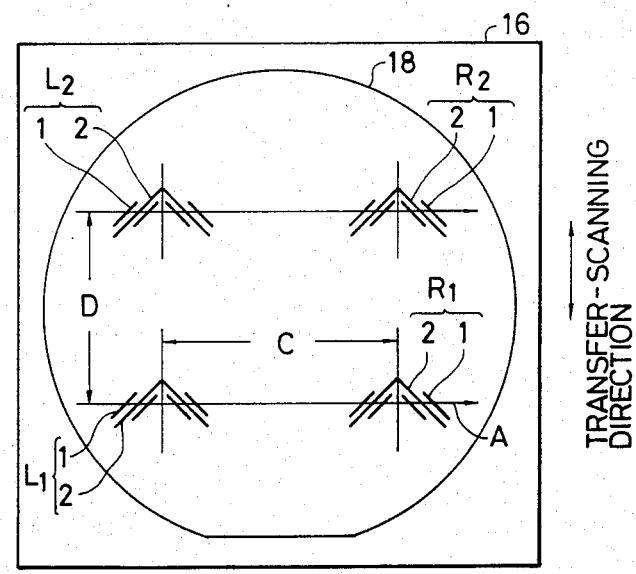
FIG. 4 shows the relation between the alignment marks when a standard mask and a standard wafer are overlapped with each other.

If the alignment marks 1, 2 at two locations spaced apart by a distance C in the x direction of the standard mask 16 and standard wafer 18 as shown in FIG. 4 are measured and the amount of alignment deviation is found from equations (1) and (2) and $R_1$, i.e. the amount of deviation of the marks 1 and 2 at the lower right location, of that amount is $(\Delta xR_1, \Delta yR_1)$ and $L_1$, i.e. the amount of deviation of the marks 1 and 2 at the lower left location, of that amount is $(66 \, xL_1, \Delta yL_1)$, then lateral magnification Mx is given by the following equation:

$$Mx = (1/C) \cdot \sqrt{(C+\Delta \times L_1 - \Delta \times R_1)^2 + (\Delta yL_1 - \Delta yR_1)^2} \tag{3}$$

It will be understood that $\Delta xR_1$ and $\Delta yR_1$ are the deviation in the x-direction and y-direction respectively of the marks 1 and 2 at the lower right location and $\Delta xL_1$ and $\Delta yL_1$ are the deviations in the x and y-directions of the marks 1 and 2 at the lower left location.

Also, if the alignment marks 1, 2 at two locations spaced apart by a distance D in the y direction are measured and the amount of alignment deviation $R_2$ is $(\Delta xR_2, \Delta yR_2)$ and $L_2$ is $(\Delta xL_2, \Delta yL_2)$, then longitudinal magnification My is given by the following equation:

$$My = (1/D) \cdot \sqrt{(\Delta \times L_1 - \Delta \times L_2)^2 + (D + \Delta yL_1 - \Delta yL_2)^2} \tag{4}$$

Similarly, $\Delta xL_2$ and $\Delta yL_2$ are the deviations in the x and y-directions of the marks 1 and 2 at the upper left location.

These operations are carried out in the operation processing circuit 21, and the magnification of the transfer optical system 17 is automatically adjusted by the adjusting driving mechanism 22 on the basis of the magnifications Mx and My given by equations (3) and (4). By doing this, the transfer error resulting from the magnification can be eliminated, but in reality, it is preferable to carry out the adjustment while trying these operations several times and taking a confirmation.

Where upper and lower alignment marks spaced apart by a distance D are to be scanned, there is no problem if the field of view of the objective lens 15 is sufficiently wide and the scanning line A can be moved in parallel with its original locus. However, where this cannot be realized, the probing apparatus including the objective lens 15 is moved by a distance D.

On the other hand, where there is a surplus in the transfer accuracy of the circuit pattern of a semiconductor device, compensation of only the lateral magnification will be required and at that time, it will be unnecessary to move the probing apparatus.

Figure 5:
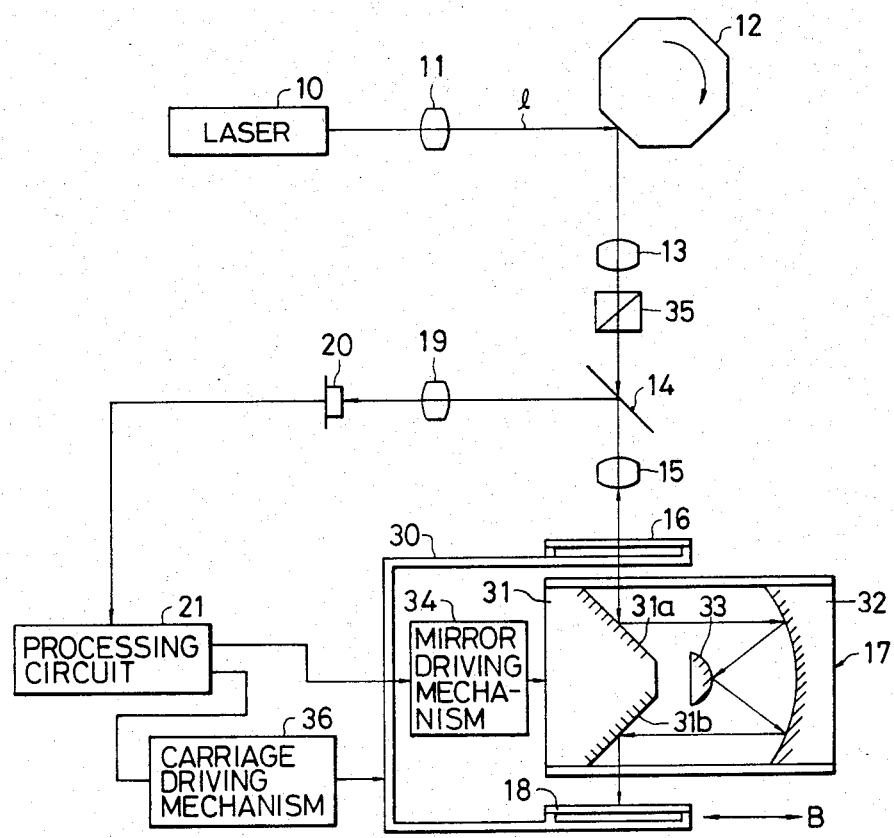
FIG. 5 is a diagram of a combination of an optical system and a compensating system showing another specific embodiment of the present invention.

A second embodiment will now be described. FIG. 5 shows the optical structure of a transfer apparatus using a reflection projection type system as the transfer optical system. In FIG. 5, reference numerals identical to those of FIG. 2 designate identical members. The standard mask 16 and wafer 18 are connected together by a carriage 30 and a transfer optical system 17 is interposed therebetween. This transfer optical system 17 comprises a trapezoidal mirror 31, a concave mirror 32 and a convex mirror 33 and is rotatable about an axis perpendicular to the surfaces of the standard mask 16 and standard wafer 18 by a mirror driving mechanism 34. The concave mirror 32 is disposed in opposed relationship with the reflecting surfaces 31a and 31b of the trapezoidal mirror 31, and the convex mirror 33 is disposed between the trapezoidal mirror 31 and the concave mirror 32 so as to face the concave mirror 32. The laser light 1 emitted from the laser light source 10 is scanned by the polygonal mirror 12, and a dividing prism 35 is inserted between the f-$\theta$ lens 13 and the half-mirror 14 so as to divide the laser light 1 into two, whereby measurements of the alignment marks 1 and 2 are effected simultaneously at two locations spaced apart by a distance C. Two of each of the objective lens 15, condenser lens 19 and photoelectric conversion element 20 are provided to receive the two laser lights provided by the prism 35, and the outputs of the photoelectric conversion elements 20, 20 are supplied to the operation processing circuit 21, the output of which is in turn transmitted to a mirror driving mechanism 34 and a carriage driving mechanism 36 for moving the carriage 30 in the direction of arrow B.

Accordingly, one of the laser lights 1 divided by the dividing prism 35 enters one reflecting surface 31a of the trapezoidal mirror 31 via the half-mirror 14, the objective lens 15 and the standard mask 16 and travels to the standard wafer 18 while being repetitively reflected by the concave mirror 32, the convex mirror 33, the concave mirror 32 and the other reflecting surface 31b of the trapezoidal mirror 31. The laser light 1 containing the information on the alignment marks 1 and 2 of the standard mask 16 and standard wafer 18 returns along its original light path and is delivered to the photoelectric conversion element 20 by the half-mirror 14. This light path exists in two series as previously described and thus, the outputs of two photoelectric conversion elements 20, 20 are applied to the operation processing circuit 21 at one time.

Figure 6:
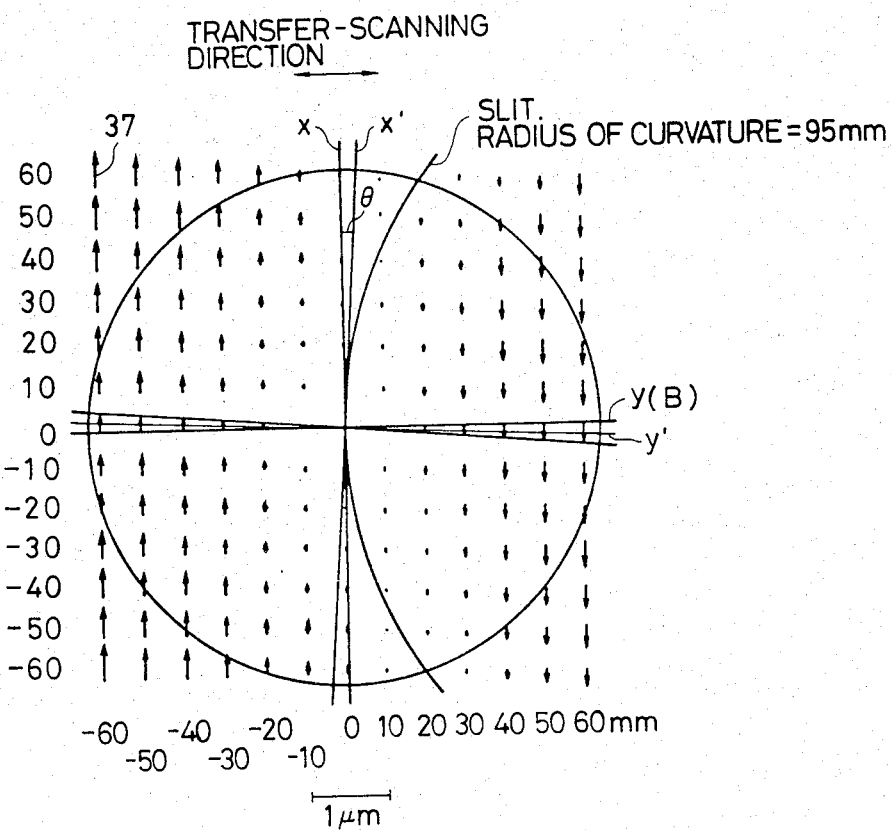
FIG. 6 illustrates a transfer error.
Figure 7A:
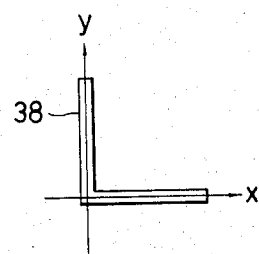
FIG. 7A shows a pattern on the mask.
Figure 7B:
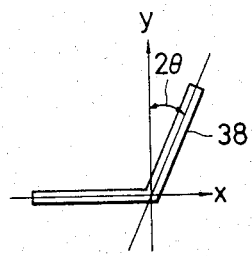
FIG. 7B shows a pattern image in which a transfer error is contained.

FIG. 6 shows the relations between the x', y' coordinates of the transfer optical system 17 in the horizontal plane, the y' axis of these coordinates being the scanning direction B of the carriage 30. The horizontal plane corresponds to a surface perpendicular to the optical axis of the optical system 17. In this case, the x', y' coordinates deviate from the x, y coordinates by the angle $\theta$. As a result an image plane distortion is produced thereby in the image formed by the transfer optical system 17. Arrows 37 depicted at intervals of 10 mm in FIG. 6 indicate the direction and magnitude of the transfer strain. At this time, the L-shaped pattern 38 as shown in FIG. 7A is image-inverted to the left and right on the wafer as the image of the transfer optical system 17, as shown in FIG. 7B, and yet the axis y is inclined by $2\theta$.

If design is made such that two sets of alignment marks 1, 2 in the x direction are positioned on the optical axes of the two objective lenses 15, the aligned condition is detected by the photoelectric conversion elements 20, 20 and the operation processing circuit 21 and the amounts of left-hand alignment deviation $\Delta xL_1$, $\Delta yL_1$ and the amounts of right-hand alignment deviation $\Delta xR_1$, $\Delta yR_1$ can be found. Subsequently, the carriage 30 is moved by a distance D in the direction of arrow B by the instruction of the operation processing circuit 21 through the carriage driving mechanism 36, and the aligned condition of other alignment marks 1, 2 is measured to obtain the amounts of deviation thereof $\Delta xL_2$, $\Delta yL_2$, $\Delta xR_2$ and $\Delta yR_2$ in a similar manner. The horizontal deviation angle $\theta x$, i.e. the angle of deviation between the axes x and x', of the alignment marks 1 and 2 of the standard mask 16 and standard wafer 18 which are spaced apart by a distance C in the x direction is approximately expressed by the following equation:

$$\theta x = (\tfrac{1}{2}C)\cdot(\Delta yL_1 - \Delta yR_1 + \Delta yL_2 - \Delta yR_2) \quad (5)$$

and the vertical deviation angle $\theta y$, i.e. the angle of deviation between the axes y and y' of the alignment marks 1 and 2 spaced apart by a distance D in the y direction is approximately expressed by the following equation:

$$\theta y = (\tfrac{1}{2}D)\cdot(\Delta xR_1 + \Delta xL_1 - \Delta xR_2 - \Delta xL_2) \quad (6)$$

These calculations are carried out by the operation processing circuit 21, and the transfer optical system 17 is rotated through the mirror driving mechanism 34 so as to reduce these deviation angles, thereby eliminating any transfer strain error. The angle by which the transfer optical system is to be driven is $$\theta = (\theta y - \theta x)/2 \quad (7)$$

where $\theta x$ is a component in which the misalignment, the optical axis and the scanning axis are not parallel in the horizontal plane. A method of displaying the result of the operation of the operation processing circuit 21 and manually adjusting the mirror driving mechanism 34 in accordance with the displayed value is suitable for a somewhat inexpensive apparatus.

As described above, the transfer error adjusting apparatus according to the present invention is designed such that the transfer optical system intervening between the mask and the wafer can be driven by an adjustment signal based on a predetermined operational equation and therefore, has an advantage that the mask and wafer can be quickly aligned with a very high degree of accuracy.

We claim:

1. A transfer apparatus comprising:
   optical means for optically relating a first object having at least one first mark thereon to a second object having at least one second mark thereon;
   detecting means for detecting the relationship between the first and second marks respectively on the first and second objects and optically related by said optical means, and for producing an output signal representing the detection;
   discriminating means for discriminating at least one of a magnification error and a distortion error which occur at the time of relating the first and second objects with each other by said optical means, in accordance with the output signal produced by said detecting means, said discriminating means producing an output signal representing the discrimination; and
   compensation means, responsive to the output signal produced by said discriminating means, for compensating for at least one of said magnification error and said distortion error.

2. A transfer apparatus according to claim 1, wherein the first object has a plurality of the first marks, the second object has a plurality of the second marks, each of the plurality of said second marks being related to one of the plurality of first marks thereby to define a plurality of sets of first and second marks and wherein said detecting means detects the relationship between each set of said first and second marks related by said optical means.

3. A transfer apparatus according to claim 2, wherein said optical means comprises a plurality of optical components and said compensation means moves at least one of said optical components.

4. A transfer apparatus according to claim 3, further comprising moving means for moving the first and second objects together with respect to said optical means.

5. A transfer apparatus according to claim 4, wherein said first and second marks are provided on the first and second objects, respectively, for compensating for the relative positional deviation caused at the time when said first and second objects are related to each other by said optical means.

6. A transfer apparatus according to claim 5, wherein said optical means comprises a concave mirror and a convex mirror.

7. A transfer apparatus according to claim 6, wherein a plurality of said sets of the first and second marks are provided along the movement direction by said moving means and the direction perpendicular thereto, respectively, at the time when said first and second objects are related to each other by said optical means.

8. A transfer apparatus comprising:
   optical means for optically relating a first object having a plurality of first marks thereon to a second object having a plurality of second marks thereon, each of the plurality of second marks being related to one of the plurality of first marks thereby to define a plurality of sets of first and second marks;
   detecting means for detecting the relationship between each set of first and second marks related by said optical means and for producing an output signal representing the detection;
   discriminating means for discriminating at least one of a magnification error and a distortion error which occur at the time of relating the first and second objects with each other by said optical means, said discriminating means performing the discrimination as aforesaid by discriminating an amount of deviation between the first and second marks in each set in accordance with the output signal produced by said detecting means and then discriminating at least one of the amount of the magnification error and the amount of the distortion error in accordance with the amount of deviation between the first and second marks in each set, said discriminating means producing an output signal representing the discrimination; and compensation means, responsive to the output signal produced by said discriminating means, for compensating for at least one of the magnification error and the distortion error.

9. A transfer apparatus according to claim 8, wherein said optical means comprises a plurality of optical components and said compensation means moves at least one of said optical components.

10. A transfer apparatus according to claim 9, further comprising moving means for moving the first and second objects together with respect to said optical means.

11. A transfer apparatus according to claim 10, wherein said optical means comprises a concave mirror and a convex mirror.

* * * * *

UNITED STATES PATENT AND TRADEMARK OFFICE
CERTIFICATE OF CORRECTION

PATENT NO. : 4,538,914

DATED : September 3, 1985

INVENTOR(S) : MINORU YOMODA, ET AL.

It is certified that error appears in the above-identified patent and that said Letters Patent is hereby corrected as shown below:

Column 1, line 28, "water" should read --wafer--; and line 44, "provide" should read --improve--.

Column 3, line 17, "$\Delta v,$" should read --$\Delta y,$--; and line 32, "$(66\ xL_1, \Delta yL_1)$" should read --$(\Delta xL_1, \Delta yL_1)$--.

Signed and Sealed this

Twenty-ninth Day of July 1986

[SEAL]

Attest:

DONALD J. QUIGG

Attesting Officer

Commissioner of Patents and Trademarks